United States Patent [19]

Feigal et al.

[11] 4,398,188
[45] Aug. 9, 1983

[54] GROUND CIRCUIT VOLTAGE DETECTOR

[76] Inventors: Donn L. Feigal, c/o Feigals, Inc., Main St., Pine Island, Minn. 55963; Ronald R. Feigal, 4219 Second Ave. N.E., Seattle, Wash. 98105

[21] Appl. No.: 309,443

[22] Filed: Oct. 7, 1981

[51] Int. Cl.³ .............................................. G08B 21/00
[52] U.S. Cl. .................................... 340/650; 340/661; 328/148
[58] Field of Search ........................ 340/650, 661, 662; 361/45, 46, 86, 91; 328/128, 148, 146, 147, 149

[56] References Cited

U.S. PATENT DOCUMENTS

| | | | |
|---|---|---|---|
| 3,119,070 | 1/1964 | Seliger | 328/128 |
| 3,737,765 | 6/1973 | Lee et al. | 340/650 |
| 3,831,160 | 8/1974 | Cronin et al. | 340/256 |
| 3,911,360 | 10/1975 | Kimzey | 340/661 |
| 3,934,176 | 1/1976 | Vasudevan et al. | 340/650 |
| 4,080,640 | 3/1978 | Elms et al. | 361/45 |
| 4,311,994 | 1/1982 | Kuribayashi | 328/148 |

*Primary Examiner*—Gerald L. Brigance
*Attorney, Agent, or Firm*—Wood, Dalton, Phillips, Mason & Rowe

[57] ABSTRACT

A ground circuit voltage detector for monitoring stray ground voltages occurring in dairy equipment to provide both an instantaneous warning indication and a sustained alarm indication. The voltage detector is connected between the equipment to be monitored at a sensing input and a separate ground. The sensed voltage is filtered and applied to a first comparator through an averaging circuit. If the average ground voltage exceeds the threshold level of the first comparator, a warning indication is provided which is proportional in strength to the sensed ground voltage. The first comparator is connected in series with a second comparator through an integrator. If the threshold level of the second comparator is exceeded, a sustained alarm indication is provided. A test circuit applies a voltage to the detector input to ensure the detector is operating properly.

13 Claims, 1 Drawing Figure

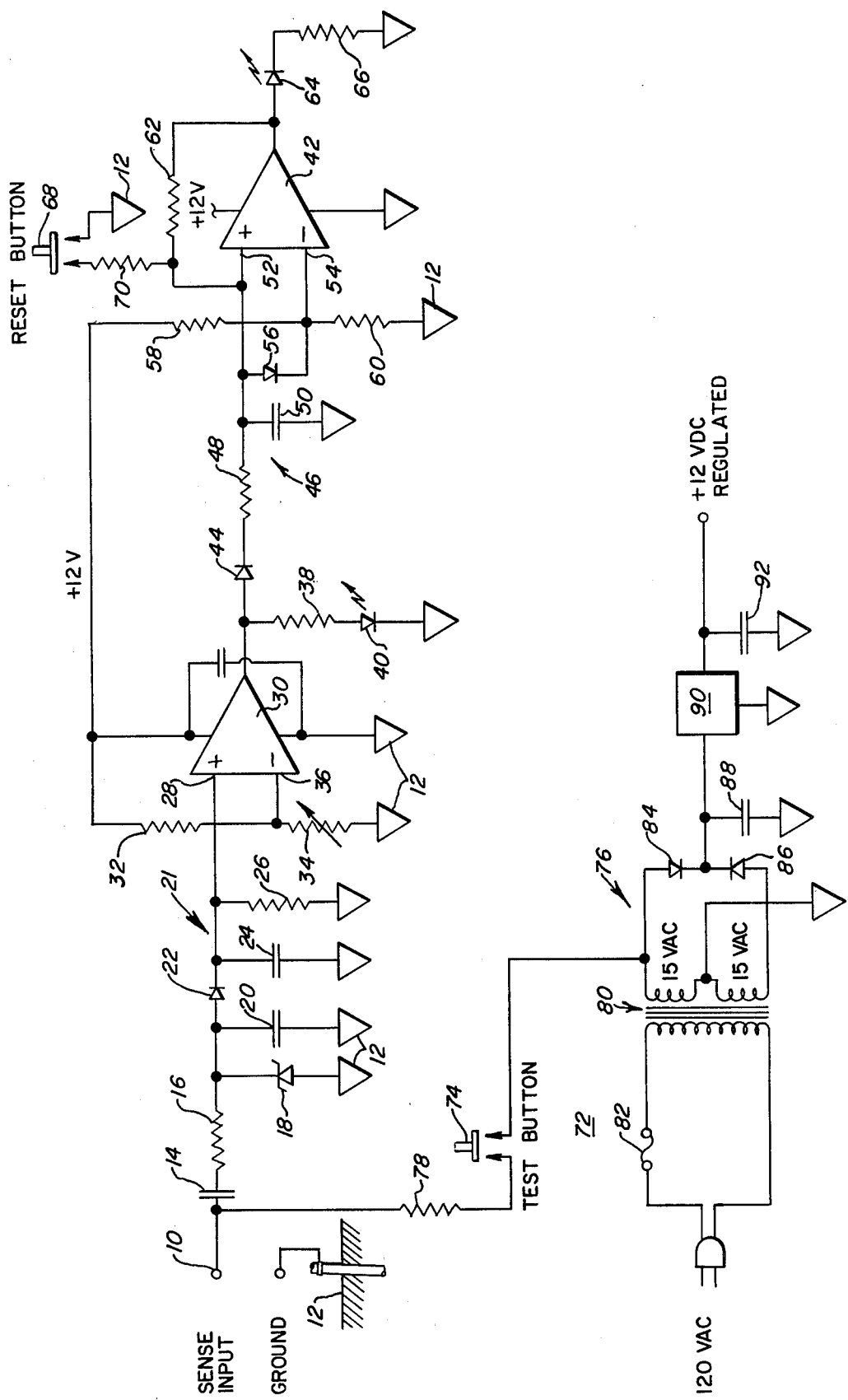

GROUND CIRCUIT VOLTAGE DETECTOR

BACKGROUND OF THE INVENTION

This invention relates to a ground circuit voltage detector for monitoring stray ground voltages occurring in a dairy parlor and for providing an instantaneous warning indication whenever the stray voltage reaches a first level and a sustained alarm indication if the stray ground voltage reaches a second level.

Dairy farms have increasingly employed electrical systems to control milking operations. These electrical systems are typically serviced by a single phase power distribution system having two 120 volt lines and a common neutral conductor to provide both 120 volt and 240 volt service. Any imbalance between the loads on the two 120 volt lines will result in circulating currents in the neutral conductor developing stray neutral-to-ground voltages which may affect the cows.

Stray ground voltages may also be developed in dairy parlor equipment such as a water trough, a stall or a stanchion pipe. Where a cow is likely to come in contact with such equipment it is necessary to monitor the ground voltages developed therein.

Dairy cows are extremely sensitive to electrical voltages. When subjected to an electric voltage, the cows may not milk out completely, become nervous, reluctant to drink and reluctant to even enter the dairy parlor or barn. Further, stray electrical voltages are believed by some to cause an increase in the incidence of mastitis and to lower milk production. The adverse effects on the dairy herd can result in serious economic loss to a dairy farmer.

Known voltage detectors have been found inadequate in monitoring stray voltages developed in the dairy parlor equipment. The known voltage detectors are complex, costly, and require continuous supervision to determine the occurrence of excessive stray ground voltages.

SUMMARY OF THE INVENTION

In accordance with the present invention, the disadvantages of prior voltage detectors have been overcome.

The ground circuit voltage detector of the present invention monitors stray ground voltages occurring in a dairy parlor and provides both an instantaneous warning indication for each occurrence of a stray ground voltage and a sustained alarm indication if the stray ground voltage reaches a selected level.

The ground circuit voltage detector may be connected between any two points that a cow may come in contact with. For example, the voltage detector may be connected between a ground connection and dairy parlor equipment such as a water trough, a stall or a stanchion pipe to monitor the stray ground voltages developed therein. The voltage detector may also be connected between a neutral conductor of a power distribution system servicing the dairy parlor and a separate ground connection to monitor stray neutral-to-ground voltages.

The voltage sensed is averaged and the average voltage is compared to a first reference voltage by a comparator. Each time the threshold level of the first comparator is exceeded by the occurrence of a stray ground voltage, an instantaneous warning indication is provided, the indication being proportional in strength to the voltage sensed.

A second comparator is connected in series with the first comparator through an integrator. The second comparator compares the integrated output of the first comparator to a second reference voltage. The second reference voltage is selected to produce a second threshold level which is approximately 30% greater than the threshold level of the first comparator. If the second threshold level is exceeded, the second comparator latches to provide a sustained alarm indication which is maintained until the second comparator is reset by an external pushbutton.

The instantaneous warning indication provided by the ground circuit voltage detector can aid in identifying the cause of the stray ground voltage. The sustained alarm indication alerts the dairy farmer to the fact that a ground voltage has occurred so that corrective measures may be taken preventing the dairy herd from being subjected to further voltages. Since the sustained alarm indication is maintained until reset, the necessity of constant supervision of the voltage detector is eliminated. Further, because the first and second comparators are connected on series, the threshold levels of the comparators may be adjusted by a single potentiometer. The circuitry of the voltage detector is simplified, requiring fewer components to provide both warning and alarm indications so that the cost of the voltage detector is minimized.

A test circuit is further provided to ensure that the voltage detector is functioning properly before being connected to the equipment to be monitored. After the ground circuit voltage detector is connected to the equipment, actuation of the test switch will provide both the warning and alarm indications if there is a faulty connection to ground.

Further advantages of the invention will be apparent from the following specification and from the drawing which is a schematic diagram of the ground circuit voltage detector.

The ground circuit voltage detector as illustrated in the drawing includes a sensing input 10 which may be connected to dairy equipment such as a water trough or a stanchion pipe or to a neutral conductor of a power distribution system servicing the dairy parlor. The power distribution system for a dairy parlor is typically single phase having two 120 volt lines with a common neutral conductor physically connected to ground. However, the voltage detector can also be used with a three-phase Y-connected power distribution system having a grounded neutral conductor. The voltage detector is connected between the equipment to be monitored at the sensing input 10 and a separate ground connection 12 which may be a metal pipe driven into the earth at a distance such as 20 or 30 feet from the ground connection of the equipment.

The ground voltage sensed by the voltage detector at the input 10 is 60 hz. as modulated by equipment associated with the power distribution system. The sensed voltage from the input 10 is filtered by a series connected capacitor 14 and a resistor 16 connected to a parallel combination of a zener diode 18 and a capacitor 20, both connected to the ground 12. The filtered voltage is applied to an averaging circuit 21 comprised of a diode 22 connected to a parallel combination of a capacitor 24 and a resistor 26 having respective values of 0.01 $\mu$F and 470 Kohms. The RC time constant provided by the capacitor 24 and the resistor 26 is such that with the diode 22 the circuit 21 operates to average the sensed ground voltage, the average voltage being applied to a non-inverting input terminal 28 of a comparator 30.

The comparator 30 compares the average sensed voltage applied to the noninverting input terminal 28 to a reference voltage, the value of which is determined by a resistor 32 and a potentiometer 34, the resistor 32 being connected between +12 volts and an inverting input terminal 36 of the comparator 30 and the potentiometer 34 being connected between the inverting input terminal 36 and the ground 12. The potentiometer 34 is adjustable to set the threshold levels of both the comparator 30 and a comparator 42 and to control the voltage range of the detector which is 0.3 to 3.0 volts RMS.

The comparator 30 provides a pulsed output having a duty cycle proportional to the sensed ground voltage when the sensed voltage from the averaging circuit 21 exceeds the threshold level of the comparator. The output of the comparator 30 is connected to a warning indicator comprised of a series connected resistor 38 and a light emitting diode (LED) 40 connected to ground. The LED 40 is pulsed in response to the output of the comparator 30, the greater the sensed voltage at the noninverting input terminal 28, the brighter the flash of the LED.

The comparator 30 is connected in series with a second comparator 42 through a diode 44 and an integrator circuit generally designated 46 and comprised of a resistor 48 and a capacitor 50 connected to the ground 12. The circuit 46 integrates the pulsed output of the comparator 30. The output of the integrator circuit 46 is applied to a noninverting input terminal 52 of the comparator 42, and is also connected to an inverting input terminal 54 of the comparator through a diode 56. The inverting input terminal 54 is connected between a resistor 58 and a resistor 60, the resistor 58 being connected to +12 volts and the resistor 60 being connected to the ground 12. A positive feedback path is provided by a feedback resistor 62 connected between the output of the comparator 42 and the noninverting input terminal 52. The reference voltage of the comparator 42 as determined by the values of the resistors 58 and 60 is selected so as to produce a threshold level for comparator 42 which is approximately 30% greater than the threshold level of comparator 30. If the voltage applied to the noninverting input terminal 52 from the integrator circuit 46 exceeds the threshold level of the comparator 42, the output of the comparator goes high, lighting a light emitting diode 64 connected to ground through a resistor 66 to provide an alarm indication.

The comparator 42 latches whenever the threshold level, determined by the resistors 58 and 60, is exceeded to maintain the LED 64 lit until reset by an external reset pushbutton 68. When actuated, the reset pushbutton 68 connects the feedback path between the resistor 62 and the noninverting input terminal 52 to the ground 12 through a resistor 70 to terminate the alarm indication from the LED 64.

The warning indication provided by the LED 40 is instantaneous, the LED flashing in response to each sensed ground voltage which exceeds the threshold level of the comparator 30. This instantaneous warning indication can aid in identifying the cause of the ground voltage so that the situation may be rectified quickly. The sustained alarm indication, provided by the LED 64 when a ground voltage exceeding the threshold level of the comparator 42 has occurred, alerts the dairy farmer to this fact. Because the LED 64 is latched on by the occurrence of a single ground voltage exceeding the threshold level of the comparator 42, minimal supervision of the voltage detector is required.

The voltage detector further includes test circuitry generally designated 72 for detecting faulty ground connections and to ensure the detector is operating properly. The test circuitry includes a test pushbutton 74 connected between a power supply 76 and the sensing input 10 of the detector through a resistor 78. The power supply includes a transformer 80 having a primary winding connected to the 120 volt A.C. line of the power distribution system through a fuse 82. The secondary winding of the transformer 76 is connected through diodes 84 and 86 to a capacitor 88 and a voltage regulator 90. The output of the voltage regulator 90 is connected to ground through a capacitor 92 and provides +12 volts D.C. to the detector.

Before the sensing input 10 of the voltage detector is connected to the equipment to be monitored, the test pushbutton 74 can be actuated to apply a 15 volt A.C. signal from the secondary winding of the transformer 76 to the input of the detector. If the voltage detector is operating properly, the 15 volt A.C. signal will light both the warning indication LED 40 and the alarm indication LED 64. After the sensing input 10 is connected to the equipment to be monitored, actuating the test pushbutton 74 will light the LEDs 40 and 64 only if there is a faulty connection to ground.

We claim:

1. A voltage detector for monitoring the ground voltage developed in equipment and connected between the equipment and a separate ground connection, comprising:
   means for sensing the voltage developed in the equipment;
   means for comprising the sensed voltage to a first reference voltage and for providing an output proportional to the sensed voltage each time the sensed voltage exceeds the first reference voltage;
   means for providing a warning indication each time the sensed voltage exceeds the first reference voltage;
   means for comparing the output of the first comparing means to a second reference voltage; and
   means for providing a sustained alarm indication if the output of the first comparing means exceeds the second reference voltage.

2. The voltage detector of claim 1 wherein the warning indication means provides a warning indication proportional in strength to the sensed voltage.

3. The voltage detector of claim 1 wherein the alarm indication means further includes a reset means, the sustained alarm indication remaining on until reset by the reset means.

4. The voltage detector of claim 1 wherein the sensing means further includes means for averaging the voltage sensed, the first comparing means comparing the average sensed voltage to the first reference voltage.

5. The voltage detector of claim 1 further including means for integrating the output of the first comparing means, the second comparing means comparing the integrated output of the first comparing means to the second reference voltage.

6. The voltage detector of claim 1 wherein the separate ground connection is provided by an earth connection spaced a distance from the earth connection of the equipment to be monitored.

7. The voltage detector of claim 1 wherein the sensing means further includes an input terminal for connection with the equipment to be monitored and further including test means connected to the input terminal and actuable to apply an alternating voltage to the sensing means for determining whether the voltage detector is operating properly.

8. The voltage detector of claim 7 wherein the test means is actuable prior to the connection of the input terminal to the equipment for providing both the warning indication and the alarm indication if the voltage detector is operating properly.

9. The voltage detector of claim 7 wherein the test means is actuable to provide both the warning indication and the alarm indication if there is a faulty connection between the voltage detector and the separate ground.

10. A voltage detector for monitoring the ground voltage developed in equipment, comprising:
   means for sensing the average ground voltage developed in the equipment;
   a first comparator for comparing the sensed ground voltage to a first reference and for providing an output signal if the sensed ground voltage exceeds the first reference;
   means for providing an instantaneous warning indication in response to the output signal of the first comparator;
   means for integrating the output signal of the first comparator;
   a second comparator for comparing the integrated output of the first comparator to a second reference voltage; and
   means for providing an alarm indication if the integrated output of the first comparator exceeds the second reference signal.

11. The voltage detector of claim 17 wherein the second comparator further includes latching means to maintain the alarm indication if the second reference voltage is exceeded.

12. The voltage detector of claim 11 further including means for resetting the second comparator to terminate the alarm indication.

13. The voltage detector of claim 10 wherein the instantaneous warning indication is proportional in strength to the sensed ground voltage.

* * * * *